US007381506B2

(12) United States Patent
Iftime et al.

(10) Patent No.: US 7,381,506 B2
(45) Date of Patent: *Jun. 3, 2008

(54) REIMAGEABLE PAPER

(75) Inventors: Gabriel Iftime, Mississauga (CA); Naveen Chopra, Oakville (CA); Peter M. Kazmaier, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/220,572

(22) Filed: Sep. 8, 2005

(65) Prior Publication Data

US 2007/0072110 A1 Mar. 29, 2007

(51) Int. Cl.
*G03F 7/004* (2006.01)

(52) U.S. Cl. .......................... 430/19; 430/11; 430/345; 430/962

(58) Field of Classification Search .................. 430/11, 430/19, 345, 962
See application file for complete search history.

(56) References Cited

U.S. PATENT DOCUMENTS 3,072,481 A * 1/1963 Berman et al. ............. 430/138
3,090,687 A * 5/1963 Berman ...................... 430/138
3,212,898 A * 10/1965 Cerreta ...................... 430/345
3,329,502 A * 7/1967 Ullman ...................... 430/338
3,507,563 A * 4/1970 Berman et al. ............. 359/603
3,961,948 A 6/1976 Saeva
4,286,957 A * 9/1981 Le Naour-Sene .............. 8/471
5,298,357 A * 3/1994 Hattori et al. .............. 430/115
6,067,185 A 5/2000 Albert et al.
6,815,679 B2 11/2004 Azuma
2005/0004361 A1 1/2005 Kumar et al.
2005/0012998 A1 1/2005 Kumar et al.
2005/0244743 A1 11/2005 Iftime et al.
2005/0244744 A1 11/2005 Kazmaier et al.
2006/0251988 A1 11/2006 Iftime et al.

OTHER PUBLICATIONS

Wojtyk et al., "Effects of metal ion complexation on the spiropyran-merocyanine interconversion: development of a thermally stable photo-switch," J. Chem. Soc. Chem, Comm., pp. 1703-1704, 1998.
U.S. Appl. No. 11/220,803, filed Sep. 8, 2005, Iftime et al.

* cited by examiner

*Primary Examiner*—Hoa V Le
(74) *Attorney, Agent, or Firm*—Oliff & Berridge PLC

(57) ABSTRACT

An image forming medium includes a substrate and a mixture including a photochromic material and a solvent wherein the mixture is coated on the substrate, such that the photochromic material exhibits a reversible homogeneous-heterogeneous transition between a colorless state and a colored state in the solvent.

19 Claims, No Drawings

REIMAGEABLE PAPER

TECHNICAL FIELD

This disclosure is generally directed to documents, and more specifically to reimageable paper, or reimageable transient documents or image forming media, and compositions and methods for making and using such reimageable paper. More particularly, in embodiments, this disclosure is directed to an image forming medium utilizing a composition comprising a photochromic compound dispersed in a solvent where the composition exhibits a reversible homogeneous-heterogeneous transition between a colored and a clear state. As a result, the precipitated colored form exhibits a very dark gray, or almost black, color. In contrast, prior photochromic materials exhibited high light absorption at only around 570 nm, providing a less contrasting, purple coloration.

CROSS-REFERENCE TO RELATED APPLICATIONS

Disclosed in commonly assigned U.S. patent application Ser. No. 11/123,163, filed May 6, 2005, is an image forming medium, comprising a polymer, a photochromic compound containing chelating groups embedded in the polymer, and a metal salt, wherein molecules of the photochromic compound are chelated by a metal ion from the metal salt.

Disclosed in commonly assigned U.S. patent application Ser. No. 10/835,518, filed Apr. 29, 2004, is an image forming method comprising: (a) providing a reimageable medium comprised of a substrate and a photochromic material, wherein the medium is capable of exhibiting a color contrast and an absence of the color contrast; (b) exposing the medium to an imaging light corresponding to a predetermined image to result in an exposed region and a non-exposed region, wherein the color contrast is present between the exposed region and the non-exposed region to allow a temporary image corresponding to the predetermined image to be visible for a visible time; (c) subjecting the temporary image to an indoor ambient condition for an image erasing time to change the color contrast to the absence of the color contrast to erase the temporary image without using an image erasure device; and (d) optionally repeating procedures (b) and (c) a number of times to result in the medium undergoing a number of additional cycles of temporary image formation and temporary image erasure.

Disclosed in commonly assigned U.S. patent application Ser. No. 10/834,722, filed Apr. 29, 2004, is a reimageable medium comprising: a substrate; and a photochromic material, wherein the medium is capable of exhibiting a color contrast and an absence of the color contrast, wherein the medium has a characteristic that when the medium exhibits the absence of the color contrast and is then exposed to an imaging light corresponding to a predetermined image to result in an exposed region and a non-exposed region, the color contrast is present between the exposed region and the non-exposed region to form a temporary image corresponding to the predetermined image that is visible for a visible time, wherein the medium has a characteristic that when the temporary image is exposed to an indoor ambient condition for an image erasing time, the color contrast changes to the absence of the color contrast to erase the temporary image in all of the following: (i) when the indoor ambient condition includes darkness at ambient temperature, (ii) when the indoor ambient condition includes indoor ambient light at ambient temperature, and (iii) when the indoor ambient condition includes both the darkness at ambient temperature and the indoor ambient light at ambient temperature, and wherein the medium is capable of undergoing multiple cycles of temporary image formation and temporary image erasure.

The entire disclosure of the above-mentioned applications are totally incorporated herein by reference.

BACKGROUND

Many paper documents are promptly discarded after being read. Although paper is inexpensive, the quantity of discarded paper documents is enormous and the disposal of these discarded paper documents raises significant cost and environmental issues. Accordingly, there is a continuing desire for providing a new medium for containing the desired image, and methods for preparing and using such a medium. In aspects thereof it would be desirable to be reusable, to abate the cost and environmental issues, and desirably also is flexible and paper-like to provide a medium that is customarily acceptable to end-users and easy to use and store.

Although there are available technologies for transient image formation and storage, they generally provide less than desirable results for most applications as a paper substitute. For example, alternative technologies include liquid crystal displays, electrophoretics, and gyricon image media. However, these alternative technologies may not in a number of instances provide a document that has the appearance and feel of traditional paper, while providing the desired reimageability.

Imaging techniques employing photochromic materials, that is materials which undergo reversible or irreversible photoinduced color changes are known, for example, U.S. Pat. No. 3,961,948 discloses an imaging method based upon visible light induced changes in a photochromic imaging layer containing a dispersion of at least one photochromic material in an organic film forming binder.

One type of composition that can be used for forming photochromic papers is disclosed in Buncel et al. (J. T. C. Wojtyk, P. M. Kazmaier, E. Buncel, *J Chem. Soc. Chem. Comm*, 1703, (1998)). The composition exhibits life-times of at least two days for solutions in acetone of spiropyrans modified with chelating groups in the presence of metallic cations. The metal cation $M^{n+}$ can stabilize the open merocyanine form through chelation.

These and other photochromic (or electric or reimageable) papers are desirable because they can provide imaging media that can be reused many times, to transiently store images and documents. For example, applications for photochromic based media include reimageable documents such as, for example, electronic paper documents. Reimageable documents allow information to be kept for as long as the user wants, then the information can be erased or the reimageable document can be re-imaged using an imaging system with different information.

Although the above-described approaches have provided reimageable transient documents, there is a desire for reimageable paper designs that provide longer image life-times. For example, while the known approaches for photochromic paper provide transient visible images, the visible images have tended to be either purple in color, which provides less image contrast and not the desired black-and-white image, and/or tended to be short in duration such as on the order of several hours, which does not provide adequate life-times for some applications.

SUMMARY

It is desirable for some uses that an image formed on a medium remains stable for extended time periods, for example, exceeding a few hours. Reimageable paper documents should maintain a written image for as long as the user needs to view it. The image may then be erased or replaced with a different image by the user on command. For electronic paper documents in applications that value viewability for more than several hours, the image should be stable for at least one or two days or beyond this.

The present disclosure addresses these and other needs, in embodiments, by providing an image forming medium utilizing a composition comprising a photochromic compound and a solvent where the composition exhibits a reversible homogeneous-heterogeneous transition between a colored and a clear state. The compositions and methods of the present disclosure provide transient images that after formation exhibit a near-black color, which provides a higher image contrast and a more conventional and desired black-and-white image appearance. The compositions and methods of the present disclosure also provide transient images that last for significantly longer periods of time, such as two days or more, before self-erase occurs. These advantages, and others, allow wider application of the reimageable transient documents.

In an embodiment, the present disclosure provides an image forming medium, comprising a substrate; and a mixture comprising a photochromic material and a solvent wherein the mixture is coated on the substrate, wherein the photochromic material exhibits a reversible homogeneous-heterogeneous transition between a colorless state and a colored state in the solvent.

In another embodiment, the present disclosure provides a method of forming a transient image, comprising:

providing an image forming medium comprising a substrate and a mixture comprising a photochromic material and a solvent wherein the mixture is coated on the substrate, wherein the photochromic material exhibits a reversible homogeneous-heterogeneous transition between a colorless state and a colored state in the solvent; and exposing the image forming medium to a ultraviolet light in an imagewise manner.

In another aspect, the present disclosure provides a method of making an image forming medium, comprising:

providing a substrate;

applying to the substrate a solvent mixture comprising a photochromic material and a solvent, wherein the photochromic material exhibits a reversible homogeneous-heterogeneous transition between a colorless state and a colored state in the solvent; and fixing the solvent mixture to the substrate.

DETAILED DESCRIPTION OF EXEMPLARY EMBODIMENTS

Generally, in various exemplary embodiments, there is provided an reimageable paper or image forming medium formed using a photochromic material, such as a spiropyran, that is dissolved, substantially dissolved, or dissolved to the extent desired, or dispersed in a solvent, where the composition exhibits a reversible homogeneous-heterogeneous transition between a colored and a clear state. By a colored state, in embodiments, refers to for example, the presence of visible wavelengths; likewise, by a colorless state, in embodiments, refers to for example, the complete or substantial absence of visible wavelengths. By "state" in embodiments is a temporary form of the composition, such as a temporary isomeric form of the photochromic material in the solvent. By "homogeneous" in embodiments refers to for example a mixture or solution where the photochromic material is uniformly, or substantially uniformly, dispersed in the solvent; heterogeneous in embodiments refers to for example a mixture or solution where the photochromic material is not uniformly dispersed in the solvent, such as where some or all of the photochromic material has precipitated or phase separated out of the solvent.

For example, the photochromic material and solvent are selected such that when the photochromic material is dissolved or dispersed in the solution, the photochromic material is in its clear state. However, when the photochromic material is exposed to an activating energy, such as ultraviolet light, the photochromic material isomerizes to a more polar form, which reversibly precipitates out of solution to form a visible material, such as in a crystalline or aggregated form. This precipitation can be reversed, and thus the image "erased" and the photochromic paper returned to a blank state, by various means such as heating the solution to a temperature that reverses the isomerization reaction and resolubilizes the photochromic material in the solvent, thus returning the photochromic material to its clear state. In the colored state, the image can remain visible for a period of two days or more, providing increased usefulness of the photochromic paper.

In embodiments, the reimageable paper generally comprises a solvent mixture of a photochromic material dispersed or dissolved in a solvent, with the solvent mixture coated on a suitable substrate material, or sandwiched between a first and a second substrate material. If desired, the solvent mixture can be further constrained on the substrate material, or between the first and second substrate materials, such as by microencapsulating the solvent mixture, or the like.

The photochromic material may exhibit photochromism, which is a reversible transformation of a chemical species induced in one or both directions by absorption of an electromagnetic radiation between two forms having different absorption spectra. The first form is thermodynamically stable and may be induced by absorption of light such as ultraviolet light to convert to a second form. The reverse reaction from the second form to the first form may occur, for example, thermally, or by absorption of light. Various exemplary embodiments of the photochromic material may also encompass the reversible transformation of the chemical species among three or more forms in the event it is possible that reversible transformation occurs among more than two forms. The photochromic material of embodiments may be composed of one, two, three, four, or more different types of photochromic materials, each of which has reversibly interconvertible forms. As used herein, the term "photochromic material" refers to all molecules of a specific species of the photochromic material, regardless of their temporary isomeric forms. For example, where the photochromic material is the species spiropyran, which exhibits isomeric forms as spiropyran and merocyanine, at any given moment the molecules of the photochromic material may be entirely spiropyran, entirely merocyanine, or a mixture of spiropyran and merocyanine. In various exemplary embodiments, for each type of photochromic material, one form may be colorless or weakly colored and the other form may be differently colored.

The photochromic material may be any suitable photochromic material that is useful in providing photochromic paper including, for example, organic photochromic materials, as long as the photochromic material in one of its different states precipitates out of the solution when an appropriate solvent is used. Examples of photochromic materials include spiropyrans and related compounds like spirooxazines and thiospiropyrans, benzo and naphthopyrans (chromenes), stilbene, azobenzenes, bisimidazols, spirodihydroindolizines, quinines, perimidinespirocyclohexadienones, viologens, fulgides, fulgimides, diarylethenes, hydrazines, anils, aryl disulfides, aryl thiosulfonates and the like. In the aryl disulfides aryl thiosulfonates, suitable aryl groups include phenyl, naphthyl, phenanthrene, anthracene, substituted groups thereof, and the like. These materials can variously undergo heterocyclic cleavage, such as spiropyrans and related compounds; undergo homocyclic cleavage such as hydrazine and aryl disulfide compounds; undergo cis-trans isomerization such as azo compounds, stilbene compounds and the like; undergo proton or group transfer phototautomerism such as photochromic quinines; undergo photochromism via electro transfer such as viologens; and the like. Specific examples of materials include:

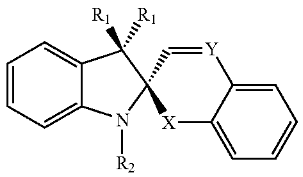

Spiropyran (X = O; Y = -CH)
Spiooxazine (X = O; Y = N)
Thiospiropyan (X = S; Y = CH)

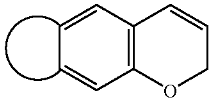

Benzo and Naphtopyran
(Chromene)

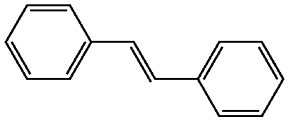

Stilbene

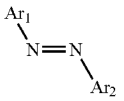

Azobenzene

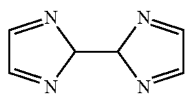

Bisimidazol

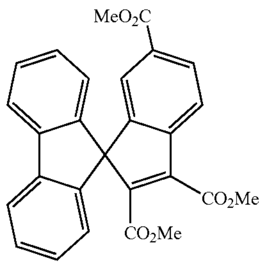

Spirodihydroindolizines

-continued

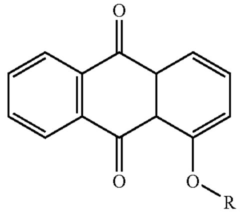

Quinone

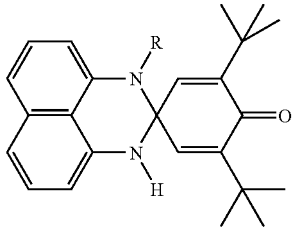

Perimidinespirocyclohexadienones

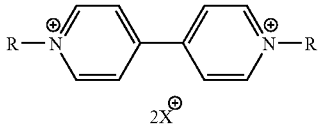

Viologen

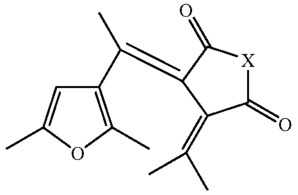

Fulgides (X = O)
Fulgimides (X = NR)

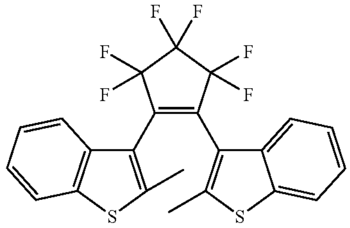

Diarylethenes

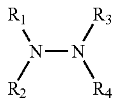

Hydrazines

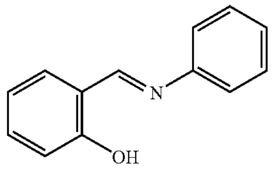

Anil

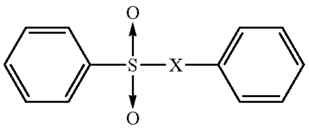

Aryl thiosulfonates

In these structures, the various R groups (i.e., R, $R_1$, $R_2$, $R_3$, $R_4$) can independently be any suitable group including but not limited to hydrogen; alkyl, such as methyl, ethyl, propyl, butyl, and the like, including cyclic alkyl groups, such as cyclopropyl, cyclohexyl, and the like, and including unsaturated alkyl groups, such as vinyl ($H_2C{=}CH{-}$), allyl ($H_2C{=}CH{-}CH_2{-}$), propynyl ($HC{\equiv}C{-}CH_2{-}$), and the like, where for each of the foregoing, the alkyl group has from 1 to about 50 or more carbon atoms, such as from 1 to about 30 carbon atoms; aryl, including phenyl, naphthyl, phenanthrene, anthracene, substituted groups thereof, and the like, and having from about 6 to about 30 carbon atoms such as from about 6 to about 20 carbon atoms; arylalkyl; such as having from about 7 to about 50 carbon atoms such as from about 7 to about 30 carbon atoms; silyl groups; nitro groups; cyano groups; halide atoms, such as fluoride, chloride, bromide, iodide, and astatide; amine groups, including primary, secondary, and tertiary amines; hydroxy groups; alkoxy groups, such as having from 1 to about 50 carbon atoms such as from 1 to about 30 carbon atoms; aryloxy groups, such as having from about 6 to about 30 carbon atoms such as from about 6 to about 20 carbon atoms; alkylthio groups, such as having from 1 to about 50 carbon atoms such as from 1 to about 30 carbon atoms; arylthio groups, such as having from about 6 to about 30 carbon atoms such as from about 6 to about 20 carbon atoms; aldehyde groups; ketone groups; ester groups; amide groups; carboxylic acid groups; sulfonic acid groups; and the like. The alkyl, aryl, and arylalkyl groups can also be substituted with groups such as, for example, silyl groups; nitro groups; cyano groups; halide atoms, such as fluoride, chloride, bromide, iodide, and astatide; amine groups, including primary, secondary, and tertiary amines; hydroxy groups; alkoxy groups, such as having from 1 to about 20 carbon atoms such as from 1 to about 10 carbon atoms; aryloxy groups, such as having from about 6 to about 20 carbon atoms such as from about 6 to about 10 carbon atoms; alkylthio groups, such as having from 1 to about 20 carbon atoms such as from 1 to about 10 carbon atoms; arylthio groups, such as having from about 6 to about 20 carbon atoms such as from about 6 to about 10 carbon atoms; aldehyde groups; ketone groups; ester groups; amide groups; carboxylic acid groups; sulfonic acid groups; and the like. $Ar_1$ and $Ar_2$ can independently be any suitable aryl or aryl-containing group including but not limited to phenyl, naphthyl, phenanthrene, anthracene, and the like, and substituted groups thereof including any of the substitutions mentioned above for the alkyl, aryl, and arylalkyl groups. X in the spiropyran formula is a suitable heteroatom such as N, O, S, and the like. Y can be —N— or —CH—. $X^-$ in the Viologen formula can be, for example, $F^-$, $Cl^-$, $Br^-$, $I^-$, $BF_4^-$, $PF_6^-$, $B(C_6H_5)_4^-$ and the like. $X^-$ in the aryl thiosulfonate can be, for example, —O—, S, —NH— and the like.

Particularly suitable in some embodiments are the spiropyrans and related compounds, although any photochromic material may be used as long as the material provides the desired color contrast and solubility properties. For example, spiropyran is suitable because it reversibly isomerizes between a colorless state (spiropyran, SP) to a colored state (merocyanine, MC) as shown below:

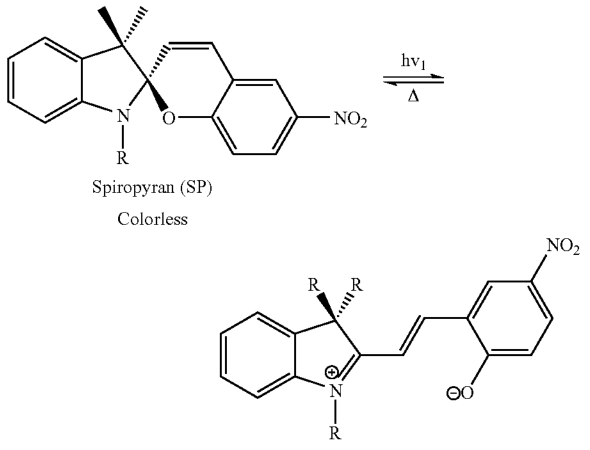

Spiropyran (SP)
Colorless

Merocyanine (MC)
Purple

That is, upon application of energy such as ultraviolet light, the material converts from a colorless spiropyran with a dipole moment of about 5 D to a colored, highly conjugated structure of merocyanine with a dipole moment of about 11 D (where the unit D (Debye) is 1 D=$3.33\times10^{-30}$ C·m). In the reverse isomerization reaction, upon application of energy such as heat, the material isomerizes from the colored merocyanine to the colorless spiropyran.

For providing the desired color change, the photochromic material is dissolved or dispersed in a suitable solvent. Any suitable solvent can be used for forming the solvent mixture. In some embodiments, the solvent is a non-polar liquid, because such non-polar liquids are good solvents for the less polar colorless form of the photochromic material, but are bad solvents for the more polar colored form of the photochromic material, thus enabling the desired precipitation of the colored form from solution, as described below. For example, suitable solvents include, but are not limited to, straight chain aliphatic hydrocarbons, branched chain aliphatic hydrocarbons, and the like, such as where the straight or branched chain aliphatic hydrocarbons have from about 1 to about 30 carbon atoms. For example, a non-polar liquid of the ISOPAR™ series (manufactured by the Exxon Corporation) may be used as the solvent. These hydrocarbon liquids are considered narrow portions of isoparaffinic hydrocarbon fractions. For example, the boiling range of ISOPAR G™ is from about 157° C. to about 176° C.; ISOPAR H™ is from about 176° C. to about 191° C.; ISOPAR K™ is from about 177° C. to about 197° C.; ISOPAR L™ is from about 188° C. to about 206° C.; ISOPAR M™ is from about 207° C. to about 254° C.; and ISOPAR V™ is from about 254.4° C. to about 329.4° C. In some embodiments, ISOPAR M™ is also a suitable solvent for the photochromic material. Other suitable solvent materials include, for example, the NORPAR™ series of liquids, which are compositions of n-paraffins available from Exxon Corporation, the SOLTROL™ series of liquids available from the Phillips Petroleum Company, and the SHELLSOL™ series of liquids available from the Shell Oil Company. Mixtures of one or more solvents, i.e., a solvent system, can also be used, if desired. In addition, more polar solvents can also be used, if desired, as long as the solvent and photochromic material are selected such that the precipitation reaction can still occur.

In examples of solvent mixtures the solvent or solvent system may be present in any desired amount, such as from about 5 to about 95 percent by weight of the total solvent mixture, such as from about 30 to about 70 percent by weight. Likewise, the photochromic material or mixture of photochromic materials may be present in any desired amount, such as from about 0.05 to about 50 percent by weight of the total solvent mixture, such as from about 0.1 to about 5 percent by weight.

Although much of this disclosure refers to the visible image being formed by the photochromic material undergoing a color change to provide a colored state when in the precipitated form, the disclosure is not limited to this embodiment. In another embodiment, the solvent and photochromic material can be chosen in such a way that the clear or less polar state is not soluble (such as precipitates from the solvent) but the colored state is soluble and is long lasting in the chosen solvent. A suitable example is a spiropyran as a photochromic molecule and a polar protic solvent such as, for example, ethanol, methanol, or isopropanol. If needed, water can be added in a required amount in order to ensure precipitation of the colorless less polar state. In this embodiment, the colored state can be achieved by UV illumination, which provides the more polar (colored) isomer. The colored state may be stable under room light because the polar solvent favors the formation of the colored isomer. The clear state can be achieved by illumination with, for example, high intensity Visible light.

The photochromic material and solvent are suitably selected such that the solvent mixture exhibits a reversible homogeneous-heterogeneous transition between a colored and a clear state. That is, the photochromic material and solvent are selected such that the solvent solubilizes the relatively less polar colorless form of the photochromic material, but does not necessarily solubilize and thus precipitates the relatively more polar colored form of the photochromic material. Although not to be desired to be limited by theory, this difference in solubility of the colorless and colored forms of the photochromic material in the solvent causes the photochromic material to be dissolved in the solvent when in the colorless form, but to precipitate out of the solvent as a visible material when in the colored form. When precipitated, the colored form of the photochromic material tends to form crystals or aggregates in embodiments, which absorb visible light over much of the visible spectrum. These crystals or aggregates can be of the order of several microns in size, and are opaque and polydisperse (meaning that not all of the precipitate/aggregate particles are of the same size). As a result, the precipitated colored form exhibits a very dark gray, or almost black, color. In contrast, prior photochromic materials exhibited high light absorption at only around 570 nm, providing a less contrasting, purple coloration.

Suitable selection of solvent and photochromic material can be readily conducted. For example, suitable selection of the materials can be made by routine testing, measurement, and/or prediction of the relative solubility of the colorless and colored forms of a particular photochromic material in a particular solvent or solvent system.

In an embodiment, selection of a suitable photochromic material can be made, for example, by comparing the relative difference in dipole moments of the colorless and colored forms of the photochromic material. For example, to permit the desired precipitation of the colored form, it is desired in embodiments that the colorless and colored forms of the photochromic material have different dipole moments, such as that the colored form have a higher or larger dipole moment than of the colorless form. In this embodiment, the colored form can have a dipole moment that is, for example, from about 3 to about 20 D, such as from about 4 or from about 5 D to about 10 or about 15 D, higher than the dipole moment of the colorless form of the photochromic material. In embodiments, the colored form can have a dipole moment that is from about 6, such as from about 7 or from about 8 or more D to about 10 or to about 12 D, higher than the dipole moment of the colorless form of the photochromic material.

In the solvent mixture of embodiments, the photochromic material is converted from the colorless to the colored state by the application of suitable energy, such as the application of ultraviolet light. The document may then be erased by heating or by illumination with visible light of an appropriate wavelength. An advantage of embodiments, however, is that the photochromic material does not revert to the colorless state at room temperature or under normal visible light. As a result, the colored form of the photochromic material, and thus the visible image, remains stable and visible for up to two days or more.

The photochromic paper may comprise a supporting substrate, coated on at least one side with the photochromic material. As desired, the substrate can be coated on either only one side, or on both sides, with the photochromic material. When the photochromic material is coated on both sides, or when higher visibility of the image is desired, an opaque layer may be included between the supporting substrate and the photochromic material layer or on the opposite side of the supporting substrate from the coated photochromic material layer. Thus, for example, if a one-sided photochromic paper is desired, the photochromic paper may include a supporting substrate, coated on one side with the photochromic material and coated on the other side with an opaque layer such as, for example, a white layer. Also, the photochromic paper may include a supporting substrate, coated on one side with the photochromic material and with an opaque layer there between. If a two-sided photochromic paper is desired, then the photochromic paper may include a supporting substrate, coated on both sides with the photochromic material layer, and with at least one opaque layer interposed between the two coated photochromic material layers. Of course, an opaque supporting substrate may be used in place of a separate supporting substrate and opaque layer, if desired.

Any suitable supporting substrate may be used. For example, suitable examples of supporting substrates include, but are not limited to, glass, ceramics, wood, plastics, paper, fabrics, textile products, polymeric films, inorganic substrates such as metals, and the like. The plastic may be for example a plastic film, such as polyethylene film, polyethylene terepthalate, polyethylene napthalate, polystyrene, polycarbonate, polyethersulfone. The paper may be, for example, plain paper such as XEROX® 4024 paper, ruled notebook paper, bond paper, silica coated papers such as Sharp Company silica coated paper, Jujo paper, and the like. The substrate may be a single layer or multi-layer where each layer is the same or different material. In embodiments, the substrate has a thickness ranging for example from about 0.3 mm to about 5 mm, although smaller or greater thicknesses can be used, if desired.

When an opaque layer is used in the photochromic paper, any suitable material may be used. For example, where a white paper-like appearance is desired, the opaque layer may be formed from a thin coating of titanium dioxide, or other suitable material like zinc oxide, inorganic carbonates, and the like. The opaque layer can have a thickness of, for example, from about 0.01 mm to about 10 mm, such as about 0.1 mm to about 5 mm, although other thicknesses can be used.

If desired, an overcoating layer may also be applied over the applied photochromic material solvent mixture. The overcoating layer may, for example, be applied to further adhere the photochromic material solvent mixture in place over the substrate, to provide wear resistance, to improve appearance and feel, and the like. The overcoating layer can be the same as or different from the substrate material, although in embodiments at least one of the overcoating layer and substrate layer is clear and transparent to permit visualization of the formed image. The overcoating layer can have a thickness of, for example, from about 0.01 mm to about 10 mm, such as about 0.1 mm to about 5 mm, although other thicknesses can be used.

In embodiments where the photochromic material is simply coated on the substrate, the coating can be conducted by any suitable method available in the art, and the coating method is not particularly limited. However, because the photochromic material is present in a solvent system, the solvent system is retained in the final product. As a result, where the photochromic material is simply coated on the substrate, a cover material is generally applied over the solvent system to constrain the solvent system in place on the substrate. Thus, for example, the cover material can be a solid layer, such as any of the suitable materials disclosed above for the substrate layer. In an alternative embodiment, a polymer material or film may be applied over the photochromic material, where the polymer film penetrates the photochromic material at discrete points to in essence form pockets or cells of photochromic material that are bounded on the bottom by the substrate and on the sides and top by the polymeric material. The height of the cells can be, for example, from about 1 micron to about 1000 microns, although not limited thereto. The cells can be any shape, for example square, rectangle circle. In these embodiments, the cover material is advantageously transparent and colorless, to provide the full color contrast effect provided by the photochromic material.

In another embodiment, the solvent system with the photochromic material can be encapsulated or microencapsulated, and the resultant capsules or microcapsules deposited or coated on the substrate as described above. Any suitable encapsulation technique can be used, such as simple and complex coacervation, interfacial polymerization, in situ polymerization, phase separation processes. For example, a suitable method if described for ink materials in U.S. Pat. No. 6,067,185, the entire disclosure of which is incorporated herein by reference and can be readily adapted to the present disclosure. Useful exemplary materials for simple coacervation include gelatin, polyvinyl alcohol, polyvinyle acetate and cellulose derivatives. Exemplary materials for complex coacervation include gelatin, acacia, acrageenan, carboxymethylecellulose, agar, alginate, casein, albumin, methyl vinyl ether-co-maleic anhydride. Exemplary useful materials for interfacial polymerization include diacyl chlorides such as sebacoyl, adipoyl, and di or polyamines or alcohols and isocyanates. Exemplary useful materials for in situ polymerization include for example polyhydroxyamides, with aldehydes, melamine or urea and formaldehyde; water-soluble oligomers of the condensate of melamine or urea and formaldehyde, and vinyl monomers such as for example styrene, methyl methacrylate and acrylonitrile. Exemplary useful materials for phase separation processes include polystyrene, polymethylmethacrylate, polyethylmethacrylate, ethyl cellulose, polyvinyl pyridine and polyacrylonitrile. In these embodiments, the encapsulating material is also transparent and colorless, to provide the full color contrast effect provided by the photochromic material.

Where the photochromic material is encapsulated, the resultant capsules can have any desired average particle size. For example, suitable results can be obtained with capsules having an average size of from about 2 to about 1000 microns, such as from about 10 to about 600 or to about 800 microns, or from about 20 to about 100 microns, where the average size refers to the average diameter of the microcapsules and can be readily measured by any suitable device such as an optical microscope. For example, in embodiments, the capsules are large enough to hold a suitable amount of photochromic material to provide a visible effect when in the colored form, but are not so large as to prevent desired image resolution.

In its method aspects, the present disclosure involves providing a reimageable medium composed of a substrate and a solvent mixture comprising a photochromic material, wherein the solvent mixture exhibits a reversible homogeneous-heterogeneous transition between a colored and a clear state to exhibit a color contrast and an absence of the color contrast. The reimageable medium is exposed to an imaging light corresponding to a predetermined image to result in an exposed region and a non-exposed region, wherein the color contrast is present between the exposed region and the non-exposed region to allow a temporary image corresponding to the predetermined image to be visible to the naked eye.

The imaging light used to form the transient image may have any suitable predetermined wavelength scope such as, for example, a single wavelength or a band of wavelengths. In various exemplary embodiments, the imaging light is an ultraviolet (UV) light having a single wavelength or a narrow band of wavelengths selected from the UV light wavelength range of about 200 nm to about 475 nm, such as a single wavelength at about 365 nm or a wavelength band of from about 360 nm to about 370 nm. For forming the image, the reimageable medium may be exposed to the imaging light for a time period ranging from about 10 milliseconds to about 5 minutes, particularly from about 30 milliseconds to about 1 minute. The imaging light may have an intensity ranging from about 0.1 $mW/cm^2$ to about 100 $mW/cm^2$, particularly from about 0.5 $mW/cm^2$ to about 10 $mW/cm^2$.

In various exemplary embodiments, imaging light corresponding to the predetermined image may be generated for example by a computer or a Light Emitting Diode (LED) array screen and the temporary image is formed on the reimageable medium by placing the medium on or in proximity to the LED screen for the desired period of time. In other exemplary embodiments, a UV Raster Output Scanner (ROS) may be used to generate the UV light in an image-wise pattern. Other suitable imaging techniques that can be used include, but are not limited to, irradiating a UV light onto the image forming medium through a mask, irradiating a pinpoint UV light source onto the image forming medium in an imagewise manner such as by use of a light pen, and the like.

To erase the image from the photochromic paper in one embodiment, the photochromic paper bearing the image may be subjected to an indoor ambient condition for an image erasing time in order to change the color contrast to the absence of color contrast. Thus, the image can, in embodiments, be erased without using an image erasure device or technique, and the image is visible only for a period of time sufficient for a user to view the image, but the period of time is also limited in order to allow the user to repeat the procedures of image formation and image erasure a number of times. As such, the medium may undergo a number of cycles of image formation and image erasure. For example, the medium may undergo image formation and image erasure of from about 2 to about 100 or about 500 or more times, such as from about 2 or about 5 or about 10 to about 40 or about 50 or more times. Accordingly, the re-imageable medium may be considered "self-erasing." However, because the colored form of the photochromic material is stable in embodiments, this self-erasure under ambient conditions may take as long as two days to two weeks or more.

In other embodiments, where faster erasure is desired so that a new image can be formed, erasure may be conducted by heating the photochromic paper to an elevated temperature. For example, heating can be conducted at a temperature of from about 50 to about 500° C., such as from about 100 to about 200° C., to enable erasure of the image. Although not limited by any specific theory, it is believed that this heating process causes the solvent to re-solubilize the photochromic material, returning the photochromic material to its colorless form.

According to various exemplary implementations, the color contrast that renders the image visible to an observer may be a contrast between, for example two, three or more different colors. The term "color" may encompass a number of aspects such as hue, lightness and saturation, where one color may be different from another color if the two colors differ in at least one aspect. For example, two colors having the same hue and saturation but are different in lightness would be considered different colors. Any suitable colors such as, for example, red, white, black, gray, yellow, cyan, magenta, blue, and purple, can be used to produce a color contrast as long as the image is visible to the naked eye of a user. In various exemplary embodiments, the following exemplary color contrasts may be used: purple temporary image on a white background; yellow temporary image on a white background; dark purple temporary image on a light purple background; and light purple temporary image on a dark purple background. However, in terms of desired maximum color contrast, a desirable color contrast is a dark gray or black image on a light or white background, such as a gray, dark gray, or black image on a white background, or a gray, dark gray, or black image on a light gray background.

In various exemplary embodiments, the color contrast may change such as, for example, diminish during the visible time, but the phrase "color contrast" may encompass any degree of color contrast sufficient to render an image discemable to a user regardless of whether the color contrast changes or is constant during the visible time.

In various exemplary embodiments, the color contrast of the image on the photochromic paper may be maintained for a period of time of, for example, at least about one day or more, at least about two days or more, or at least about four days or more, and for up to about four days, about one, about two, about three, or about four weeks, or more. For example, in order to enable its use as long-term electronic paper, the color contrast of the temporary image on the photochromic paper in embodiments may be maintained for a period of time of at least about two days or at least about four days to about one or about two weeks, or for at least about one week or at least about two weeks to at least about three weeks or at least about four weeks.

An example is set forth hereinbelow and is illustrative of different compositions and conditions that can be utilized in practicing the disclosure. All proportions are by weight unless otherwise indicated. It will be apparent, however, that the disclosure can be practiced with many types of compositions and can have many different uses in accordance with the disclosure above and as pointed out hereinafter.

EXAMPLES

Example 1

A saturated solution was prepared by dissolving spiropyran in its clear form in ISOPAR M® as a solvent. A cell was made by sandwiching two glass slides, with a controlled thickness of 300 microns using 300 micron spaces. The cell was filled with the spiropyran solution by capillarity and sealed with epoxy glue.

The cell was illuminated with UV light at a wavelength of 365 nm for one minute to obtain a colored state. Initially, the color was a very dark purple, but in a few minutes the color faded to a dark gray color. Immediately after exposure to UV light, the colored state was formed of precipitated material (black color) and purple color. The purple color was attributed to a small amount of the merocyanine (colored state of spiropyran) still dissolved in the solvent. The purple color faded in minutes, as expected when the merocyanine remains dissolved in the solvent rather than precipitated out as a stable, dark-colored solid.

The sample was kept under room conditions for three days. There was only very little decay of the colored state after one day. Even after three days, an image was easily read on the device. The sample exhibits absorption over the entire visible region of the spectrum, because the precipitate particles are black. This provides a high contrast black/white display.

After three days, the sample was erased, i.e., the spiropyran was converted back to its clear state, by heating at a temperature of 150° C. The writing/erasing cycle was repeated 5 times without noticeable degradation of the device.

The reflection spectra of the clear and colored forms were measured after one day. The sample was placed over a white background to measure the reflectance. A black and white display was formed by the sample. The optical density of the clear state was OD=0.2, while the optical density of the colored state was OD=0.84. This optical density of the colored state can be further improved, for example, by altering the size of the precipitated crystals, the thickness of the device, reducing the size of voids between the crystals, and the like.

Comparative Example 1

For comparison to Example 1, similar devices are made using the same spiropyran material (0.050 g), but (1) with tetrahydrofuran (2.5 ml), a solvent that solubilizes both the colorless and the colored forms of the spiropyran, and (2) poly(methylmethacrylate) as a polymer network that essentially immobilizes the spiropyran but is miscible with both colorless and colored forms, are used in place of the ISOPAR M® solvent of Example 1. The polymer was deposed as a solution containing tetrahydrofuran (2.5 ml), polymethylemethacrylate (0.32 g) and spiropyran (0.050 g). After coating with a blade the coating is allowed to dry for 15 hours at room temperature for complete removal of the solvent. The samples are exposed to UV light in the same manner as Example 1. In the case of the sample made using a solvent that solubilizes both the colorless and the colored forms of the spiropyran, the color fades only minutes after illumination. In the case of the sample made using a polymer, the color fades about one day after illumination.

Example 2

40 grams of a saturated solution of spiropyran in its clear form in ISOPAR M® as a solvent was encapsulated by using the technique of complex coacervation under high shear from an overhead mixer equipped with a 3-blade impeller. The encapsulation solution was prepared by mixing the following solutions, heated at 40° C.: 100 mL of 6.6% gelatin solution, 400 mL of water, and 100 mL of a 6.6% solution of gum Arabic solution in warm water. Next, the pH of the encapsulation solution was adjusted to 4.5 via dropwise addition of dilute acetic acid solution. The spiropyran solution was poured into the encapsulation bath, and allowed to cool to room temperature (23-25° C.). The resultant capsules were crosslinked with gluteraldehyde, washed with water, and wet-sieved to isolate the desired capsule size.

To prepare the device, a first Mylar substrate was coated with a layer of polyvinyl alcohol (PVA) at a thickness of 3 mils, and air dried for 20 hours at room temperature (23-25° C.). 6 grams of wet sieved capsules (average size less than 200 microns) were separated by gravitation on a filter paper from most of the water in which the capsules are kept. The capsules were mixed with a solution containing 0.5 g of a 30% solution of PVA, 3 drops of 1-octanol as a defoamer, and 75 mg of glycerol as a plasticizer for the PVA. The composition was coated with a blade on top of the first PVA layer on the Mylar substrate. The film was dried at room temperature (23-25° C.) for 20 hours. The capsules deformed during the dewatering process. The film was then coated with a layer of NeoRez, a water-based polyurethane glue, by using a blade, and was dried for one hour at room temperature (23-25° C.) and for an additional hour at 50° C. A second Mylar substrate was coated with NeoRez glue with a blade (10 mils gap), then was dried for one hour at room temperature (23-25° C.) and for an additional 30 minutes at 50° C. The two substrates were laminated together to form a final device that switches between black and white states.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. An image forming medium, comprising a substrate; and a mixture comprising a photochromic material and a solvent wherein said mixture is coated on said substrate, and wherein the image forming medium is configured to constrain the mixture in place on the substrate;

wherein the photochromic material and the solvent are selected so that:

the photochromic material exhibits a reversible homogeneous-heterogeneous transition between a colorless state and a colored state in the solvent;

the photochromic material in its colorless state remains dispersed in the solvent, but phase separates from the solvent when the photochromic material is in its colored state; and the photochromic material in its colored state phase separates out of the solvent in the form of opaque, polydisperse crystals; and wherein the image forming medium is configured so that:

the image forming medium may undergo image formation and image erasure at least two times; and an image formed on the image forming medium remains stable and visible under indoor ambient conditions for at least two days.

2. The image forming medium of claim 1, wherein the solvent solubilizes the photochromic material when the photochromic material is in its colorless state.

3. The image forming medium of claim 1, wherein the solvent does not solubilize the photochromic material when the photochromic material is in its colored state.

4. The image forming medium of claim 1, wherein the solvent mixture is applied to the substrate in a layer or as microcapsules.

5. The image forming medium of claim 1, wherein the photochromic compound is selected from the group consisting of a spiropyran compound, spirooxazine, thiospiropyran, a benzo compound, naphthopyran, stilbene, azobenzene, bisimidazol, spirodihydroindolizine, quinine, perimidinespirocyclohexadienone, viologen, fulgide, fulgimide, diarylethene, hydrazine, anil, aryl disulfide, and aryl thiosulfonate.

6. The image forming medium of claim 1, wherein the photochromic compound is a spiropyran compound.

7. The image forming medium of claim 1, wherein the photochromic material in its colored state has a dipole moment that is greater than a dipole moment of the photochromic material in its colorless state.

8. The image forming medium of claim 1, wherein the dipole moment of the photochromic material in its colored state is from about 3 D to about 15 D higher than a dipole moment of the photochromic material in its colorless state.

9. The image forming medium of claim 1, wherein the solvent is a nonpolar solvent.

10. The image forming medium of claim 1, wherein the solvent is selected from the group consisting of straight chain aliphatic hydrocarbons, branched chain aliphatic hydrocarbons, and mixtures thereof.

11. The image forming medium of claim 1, wherein a stability of the image forming medium is from about two days to about four weeks.

12. The image forming medium of claim 1, further comprising an overcoating layer over the applied solvent mixture.

13. The image forming medium of claim 1, wherein the substrate is selected from the group consisting of glass, ceramic, wood, plastic, paper, fabric, textile, metals, plain paper, and coated paper.

14. The image forming medium of claim 1, wherein the solvent mixture is provided in the form of encapsulated amounts of the solvent mixture.

15. A method of forming a transient image, comprising:

providing an image forming medium comprising:

a substrate; and a mixture comprising a photochromic material and a solvent wherein said mixture is coated on said substrate, and wherein the image forming medium is configured to constrain the mixture in place on the substrate;

wherein the photochromic material and the solvent are selected so that:

the photochromic material exhibits a reversible homogeneous-heterogeneous transition between a colorless state and a colored state in the solvent;

the photochromic material in its colorless state remains dispersed in the solvent, but phase separates from the solvent when the photochromic material is in its colored state; and the photochromic material in its colored state phase separates out of the solvent in the form of opaque, polydisperse crystals; and wherein the image forming medium is configured so that:

the image forming medium may undergo image formation and image erasure at least two times; and an image formed on the image forming medium remains stable and visible under indoor ambient conditions for at least two days; and exposing the image forming medium to a UV light in an imagewise manner.

16. The method of claim 15, wherein the exposing is for a time period ranging from about 10 milliseconds to about 5 minutes at an intensity ranging from about 0.1 $mW/cm^2$ to about 100 $mW/cm^2$.

17. The method of claim 15, further comprising:

erasing the image by heating the image forming medium at a temperature above about 100° C.

18. A method of making an image forming medium, comprising:

providing a substrate;

applying to the substrate a solvent mixture comprising a photochromic material and a solvent, wherein the photochromic material and the solvent are selected so that:

the photochromic material exhibits a reversible homogeneous-heterogeneous transition between a colorless state and a colored state in the solvent;

the photochromic material in its colorless state remains dispersed in the solvent, but phase separates from the solvent when the photochromic material is in its colored state; and the photochromic material in its colored state phase separates out of the solvent in the form of opaque, polydisperse crystals; and fixing said solvent mixture to said substrate;

wherein the image forming medium is configured so that:

the image forming medium may undergo image formation and image erasure at least two times; and an image formed on the image forming medium remains stable and visible under indoor ambient conditions for at least two days.

19. The method of claim 18, wherein said solvent mixture is applied to said substrate in a form of capsules encapsulating said solvent mixture.

* * * * *